(12) United States Patent
Balseanu et al.

(10) Patent No.: US 8,252,653 B2
(45) Date of Patent: Aug. 28, 2012

(54) METHOD OF FORMING A NON-VOLATILE MEMORY HAVING A SILICON NITRIDE CHARGE TRAP LAYER

(75) Inventors: Mihaela Balseanu, Sunnyvale, CA (US); Vladimir Zubkov, Mountain View, CA (US); Li-Qun Xia, Cupertino, CA (US); Atif Noori, Saratoga, CA (US); Reza Arghavani, Scotts Valley, CA (US); Derek R. Witty, Fremont, CA (US); Amir Al-Bayati, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 326 days.

(21) Appl. No.: 12/255,617

(22) Filed: Oct. 21, 2008

(65) Prior Publication Data

US 2010/0096687 A1  Apr. 22, 2010

(51) Int. Cl.
*H01L 21/336* (2006.01)
*H01L 21/3205* (2006.01)
*H01L 21/4763* (2006.01)
*H01L 21/31* (2006.01)
*H01L 21/469* (2006.01)
*H01L 29/792* (2006.01)
*H01L 29/66* (2006.01)

(52) U.S. Cl. ........ 438/287; 438/257; 438/261; 438/289; 438/591; 438/783; 438/791; 257/324; 257/325; 257/E29.309; 257/E21.243

(58) Field of Classification Search .................. None
See application file for complete search history.

(56) References Cited

U.S. PATENT DOCUMENTS

| | | | |
|---|---|---|---|
| 5,217,567 A * | 6/1993 | Cote et al. | 216/67 |
| 5,264,724 A | 11/1993 | Brown et al. | |
| 5,440,507 A | 8/1995 | Brady et al. | |
| 5,508,067 A * | 4/1996 | Sato et al. | 427/579 |
| 5,989,623 A | 11/1999 | Chen et al. | |
| 6,037,235 A | 3/2000 | Narwankar et al. | |
| 6,207,222 B1 | 3/2001 | Chen et al. | |

(Continued)

FOREIGN PATENT DOCUMENTS

JP  05275400  10/1993

(Continued)

OTHER PUBLICATIONS

Essafti et al. in "Chemical vapor deposition synthesis and characterization of co-deposited silicon-nitrogen-boron materials", Journal of Materials Research, vol. 11, No. 10, Oct. 1996, p. 2565-2574.*

(Continued)

*Primary Examiner* — Nathan Ha
*Assistant Examiner* — Michael Jung
(74) *Attorney, Agent, or Firm* — Ashok K. Janah; Janah & Associates, P.C.

(57) ABSTRACT

A flash memory device and methods of forming a flash memory device are provided. The flash memory device includes a doped silicon nitride layer having a dopant comprising carbon, boron or oxygen. The doped silicon nitride layer generates a higher number and higher concentration of nitrogen and silicon dangling bonds in the layer and provides an increase in charge holding capacity and charge retention time of the unit cell of a non-volatile memory device.

23 Claims, 3 Drawing Sheets

U.S. PATENT DOCUMENTS

| | | |
|---|---|---|
| 6,413,871 B2 | 7/2002 | M'Saad et al. |
| 6,537,905 B1 | 3/2003 | Chen et al. |
| 6,750,157 B1 | 6/2004 | Fastow et al. |
| 6,768,157 B2 | 7/2004 | Krieger et al. |
| 6,806,203 B2 | 10/2004 | Weidman et al. |
| 6,878,620 B2 | 4/2005 | Nguyen et al. |
| 6,906,390 B2 | 6/2005 | Nomoto et al. |
| 6,925,007 B2 | 8/2005 | Harari et al. |
| 7,033,956 B1 | 4/2006 | Wu |
| 7,064,078 B2 | 6/2006 | Liu et al. |
| 7,079,740 B2 | 7/2006 | Vandroux et al. |
| 7,112,528 B2 | 9/2006 | Chen et al. |
| 7,163,877 B2 | 1/2007 | Niimi et al. |
| 7,183,166 B2 | 2/2007 | Wang et al. |
| 7,220,982 B2 | 5/2007 | Campbell |
| 7,229,911 B2 | 6/2007 | Rajagopalan et al. |
| 7,253,046 B2 | 8/2007 | Higashi et al. |
| 7,253,123 B2 | 8/2007 | Arghavani et al. |
| 7,259,433 B2 | 8/2007 | Nomoto et al. |
| 7,294,581 B2 | 11/2007 | Iyer et al. |
| 7,341,918 B2 | 3/2008 | Harari et al. |
| 7,342,279 B2 | 3/2008 | Harari et al. |
| 7,355,235 B2 | 4/2008 | Wang et al. |
| 7,407,893 B2 | 8/2008 | Seamons et al. |
| 7,416,995 B2 | 8/2008 | Iyer et al. |
| 7,601,589 B2 | 10/2009 | Kim |
| 7,619,247 B2 | 11/2009 | Moore et al. |
| 7,638,440 B2 | 12/2009 | Wang et al. |
| 7,659,205 B2 | 2/2010 | Campbell |
| 2003/0017670 A1* | 1/2003 | Luoh et al. .............. 438/257 |
| 2003/0122204 A1 | 7/2003 | Nomoto et al. |
| 2003/0155602 A1 | 8/2003 | Krieger et al. |
| 2003/0176058 A1 | 9/2003 | Weidman et al. |
| 2003/0178667 A1 | 9/2003 | Krieger et al. |
| 2004/0009642 A1 | 1/2004 | Yoo et al. |
| 2004/0026729 A9 | 2/2004 | Krieger et al. |
| 2004/0092095 A1 | 5/2004 | Nguyen et al. |
| 2004/0235292 A1 | 11/2004 | Rajagopalan et al. |
| 2005/0088261 A1 | 4/2005 | Lin et al. |
| 2005/0199013 A1 | 9/2005 | Vandroux et al. |
| 2005/0199585 A1 | 9/2005 | Wang et al. |
| 2005/0202683 A1 | 9/2005 | Wang et al. |
| 2005/0224866 A1 | 10/2005 | Higashi et al. |
| 2005/0230766 A1 | 10/2005 | Nomoto et al. |
| 2005/0287771 A1 | 12/2005 | Seamons et al. |
| 2006/0046479 A1 | 3/2006 | Rajagopalan et al. |
| 2006/0131555 A1 | 6/2006 | Liu et al. |
| 2006/0131556 A1 | 6/2006 | Liu et al. |
| 2006/0131675 A1 | 6/2006 | Wang et al. |
| 2006/0231823 A1 | 10/2006 | Moore et al. |
| 2006/0244086 A1 | 11/2006 | Yin et al. |
| 2007/0007583 A1 | 1/2007 | Lee et al. |
| 2007/0087575 A1 | 4/2007 | Iyer et al. |
| 2007/0111546 A1 | 5/2007 | Iyer et al. |
| 2007/0119546 A1 | 5/2007 | Collins et al. |
| 2007/0120179 A1 | 5/2007 | Park et al. |
| 2007/0132054 A1 | 6/2007 | Arghavani et al. |
| 2007/0184605 A1 | 8/2007 | Lee |
| 2007/0210372 A1 | 9/2007 | Park et al. |
| 2007/0238254 A1 | 10/2007 | Ordonio |
| 2008/0020591 A1 | 1/2008 | Balseanu et al. |
| 2008/0023744 A1 | 1/2008 | Shin et al. |
| 2008/0076224 A1 | 3/2008 | Ryu et al. |
| 2008/0093589 A1 | 4/2008 | Liu et al. |
| 2008/0093660 A1 | 4/2008 | Park et al. |
| 2008/0093661 A1 | 4/2008 | Joo et al. |
| 2008/0121887 A1 | 5/2008 | Choi et al. |
| 2008/0157185 A1* | 7/2008 | Joo et al. .............. 257/324 |
| 2008/0272424 A1 | 11/2008 | Kim et al. |
| 2008/0277641 A1 | 11/2008 | Stanton |
| 2009/0035927 A1 | 2/2009 | Olsen et al. |
| 2009/0087977 A1 | 4/2009 | Spuller et al. |
| 2009/0104782 A1 | 4/2009 | Lu et al. |
| 2009/0256132 A1 | 10/2009 | Scheuerlein et al. |
| 2009/0258489 A1 | 10/2009 | Chen et al. |

FOREIGN PATENT DOCUMENTS

| | | |
|---|---|---|
| JP | 11040682 | 2/1999 |
| JP | 2001189390 | 7/2001 |
| JP | 2002067412 | 3/2002 |
| JP | 2003068893 | 3/2003 |
| JP | 2003224274 | 8/2003 |
| JP | 2005333112 | 12/2005 |
| JP | 2006237311 | 9/2006 |
| JP | 2006253192 | 9/2006 |
| WO | WO-9304506 | 3/1993 |
| WO | WO-9424707 | 10/1994 |
| WO | WO-9705665 | 2/1997 |
| WO | WO-9707550 | 2/1997 |
| WO | WO-9909593 | 2/1999 |
| WO | WO-2005076337 | 8/2005 |
| WO | WO-2005087974 | 9/2005 |
| WO | WO-2005091349 | 9/2005 |
| WO | WO-2005109473 | 11/2005 |
| WO | WO-2007047019 | 4/2007 |
| WO | WO-2007058720 | 5/2007 |
| WO | WO-2007149788 | 12/2007 |

OTHER PUBLICATIONS

Saraf, M. et al. in "Low thermal budget SiO2/Si3N4/SiO2 stacks for advanced SONOS memories", Sep. 14, 2007, J. Appl. Phys. 120, 054512.*

Kennedy, G. et al. in "Oxidation of silicon nitride films in an oxygen plasma", 1999, J. Appl. Phys. 85, 3319.*

Kapoor, V. et al. in "Hydrogen-related memory traps in thin silicon nitride films", 1983, J. Vac. Sci. Technol. A 1(2), 600.*

Noel, et al., "Impact of ultraviolet light during rapid thermal diffusion" Apl. Phys. Ltrs., vol. 72, No. 39, May 18, 1998.

Office Action dated Mar. 9, 2010 in U.S. Appl. No. 12/256,173 entitled "Flash Memory With Treated Charge Trap Layer" (US).

Office Action dated Nov. 18, 2009 in U.S. Appl. No. 12/256,119, entitled "Non-volatile memory having charge trap layer with compositional gradient" (US).

US Patent Application titled: "Passivating Glue Layer to Improve Amorphous Carbon to Metal Adhesion".

International Preliminary Report on Patentability, PCT/US2009/061390, Mailing Date May 5, 2011.

Choi, S.M., et al., "Memory characteristics of silicon nitride with silicon nanocrystals as a charge trapping layer of nonvolatile memory devices", Appl. Phys. Lett. 86, 251901 (2005).

International Search Report, PCT Application PCT/US2009/061390, mailed May 25, 2010.

* cited by examiner

METHOD OF FORMING A NON-VOLATILE MEMORY HAVING A SILICON NITRIDE CHARGE TRAP LAYER

BACKGROUND

Non-volatile memory devices, such as flash memory, are capable of retaining stored charge without power from an external power supply. A flash memory comprises an array of memory cells, each of which is configured to store one or more bits of information corresponding to a charge or gate threshold voltage. For example, new flash memory devices can store several bits per cell and utilize parameters that can exhibit more than two distinct levels. Flash memory devices are typically of two types depending on their structure for storing charge. A floating gate type flash memory stores charge in a floating gate electrode disposed under a control gate electrode. However, the conductive floating gate electrodes need to be electrically isolated for data retention, and the gate structures have a high aspect ratio that can be difficult to manufacture. Also, the density of such flash memory devices increases, the spacing between adjacent memory cells decreases resulting in electrical coupling between adjacent floating gate cells which reduces charge retention time.

A charge trap type flash memory can be manufactured with fewer and less complicated steps than floating gate memory devices. Charge trap memories use a gate insulating layer formed of a material such as silicon nitride, which provides charge trap sites. However, as these devices become smaller, the net area available on a substrate to create an individual charge trap cell decreases. Accordingly, the number of electrons that may be loaded onto a charge trap layer also decreases. This decrease in charge trap cell capacity decreases the amount of information that may be stored by each unit cell.

For various reasons that include these and other deficiencies, and despite the development of various flash memory devices, further improvements in memory devices and charge trap devices are continuously being sought.

SUMMARY

A flash memory device is fabricated by forming a silicon dioxide layer on a substrate. A doped silicon nitride layer is formed on the silicon dioxide layer, the doped silicon nitride layer comprising a dopant comprising carbon, boron or oxygen. A dielectric material is deposited on the doped silicon nitride layer and a conductive gate is deposited on the dielectric material.

The flash memory device comprises a substrate comprising silicon, a silicon dioxide layer on the substrate, and a doped silicon nitride layer on the silicon dioxide layer. The doped silicon nitride layer comprises a dopant comprising carbon, boron or oxygen. A dielectric material is formed on the doped silicon nitride layer, and a conductive gate on the dielectric material In another method, a silicon dioxide layer is formed on a substrate, and a silicon nitride layer is formed on the silicon dioxide layer. The silicon nitride layer comprises a compositional gradient in which the ratio of silicon to nitrogen varies through the thickness of the layer. A dielectric material is deposited on the silicon nitride layer and a conductive gate layer is deposited on the dielectric material.

Another flash memory device comprises a substrate comprising silicon, a silicon dioxide layer on the substrate, and a silicon nitride layer on the silicon dioxide layer. The silicon nitride layer comprises a compositional gradient in which the ratio of silicon to nitrogen varies through the thickness of the layer. A dielectric material is on the silicon nitride layer, and a conductive gate on the dielectric material.

Another method comprises forming a silicon dioxide layer on a substrate and forming a silicon nitride layer on the silicon dioxide layer. The silicon nitride layer is exposed to ultraviolet radiation having a wavelength of from about 150 nm to about 1200 nm. A dielectric material is deposited on the silicon nitride layer, and a conductive gate is deposited on the dielectric material.

In yet another method, a silicon dioxide layer is formed on a substrate and a silicon nitride layer is formed on the silicon dioxide layer. The silicon nitride layer is exposed to an electron beam. A dielectric material is deposited on the silicon nitride layer, and a conductive gate is deposited on the dielectric material.

In still another method, a silicon dioxide layer is formed on a substrate. A plasma-treated silicon nitride layer is formed on the silicon dioxide layer by: (1) placing the substrate in a process zone; (2) depositing a silicon nitride layer on the substrate by (i) introducing a first process gas into the process zone, the first process gas comprising a silicon-containing component and a nitrogen-containing component, and generating a plasma of the first process gas in the process zone to; and (3) forming a plasma-treated silicon nitride layer by (i) stopping or changing the flow of the first process gas to provide a second process gas into the process zone, the second process gas comprising an inert or non-reactive gas, and (ii) generating a plasma of the second process gas in the process zone to treat the deposited silicon nitride layer, depositing a dielectric material on the silicon nitride layer, and depositing a conductive gate on the dielectric material.

DRAWINGS

These features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1:
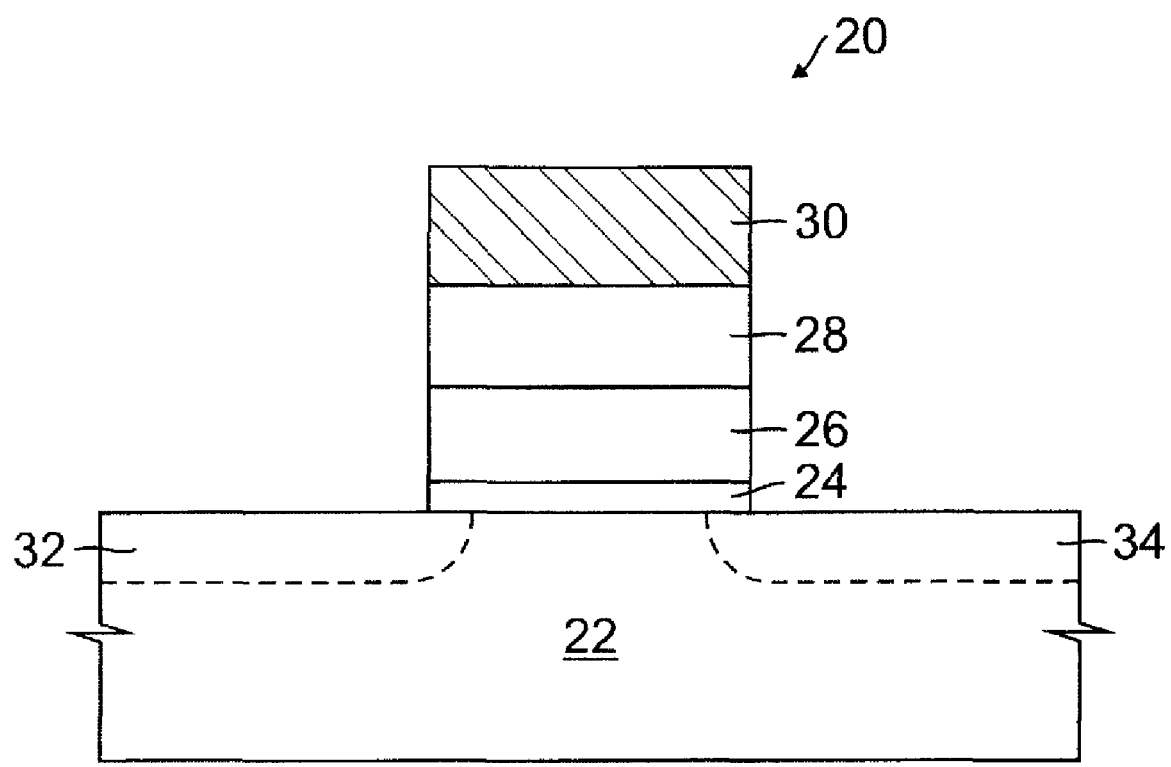
FIG. 1 is a schematic cross-sectional view of a substrate showing a flash memory device with a treated silicon nitride feature.

In one embodiment, a flash memory device 20 is fabricated on a substrate 22 comprising a semiconductor, such as a silicon wafer, compound semiconductor, or dielectric. A silicon wafer comprises single or large crystals of silicon, germanium, or silicon germanium. An exemplary compound semiconductor comprises gallium arsenide. A suitable dielectric comprises a glass panel or display, and can include, for example, borophosphosilicate glass, phosphosilicate glass, borosilicate glass, and phosphosilicate glass, among other materials.

A silicon dioxide layer 24 is formed on the substrate 22 to serve as a tunneling oxide film. The tunneling oxide film can contact source/drains 32, 34 composed of impurity regions formed in the semiconductor substrate 22. The silicon dioxide layer 24 can be formed by suitable methods including CVD or PECVD using process gases that include a silicon-containing compound and oxygen-containing compound such as tetraethylorthosilane (TEOS), silane, oxygen, and other such gases. The silicon dioxide layer 24 can also be made by oxidizing a surface of a silicon wafer. Typically, the silicon dioxide layer 24 has a thickness of from about 1 to about 6 nm.

A silicon nitride layer 26 is formed on the silicon dioxide layer 24. The silicon nitride layer 26 is used as a charge trapping layer for the flash memory device 20. The charge trapping or storing layer includes trap sites which store charge passing through the tunneling oxide film. Before, during, or after deposition of the silicon nitride layer 26, the silicon nitride layer is treated to increase the charge retention capability of the layer as described herein.

A dielectric material 28 other than silicon nitride, is deposited on the silicon nitride layer 26. The dielectric material 28 serves as a charge blocking layer which reduces leakage of the electrons trapped in the charge trap layer to the gate electrode 30. The blocking layer can also prevent or resist passage of charge from the other direction, namely from the gate electrode 30 into the charge trapping layer. The dielectric material 28 can be a high-k dielectric such as, for example $Al_2O_3$, $SiO_2$, $HfO_2$, $ZrO_2$, LaO, LaAlO, LaHfO, HfAlO, HfAlON, $HfSiO_x$, HfSiON, and combinations thereof. One suitable high-k dielectric material comprises aluminum oxide, which has a dielectric constant (k) value of about 9-11. The dielectric material 28 can be deposited by physical vapor deposition (PVD), atomic layer deposition (ALD) or chemical vapor deposition (CVD).

A gate electrode 30 is formed on the dielectric material 28. The gate electrode 30 is formed from a conductive material having an appropriate work function for the unit cell. For example, the gate electrode 30 can be a metal gate which is made from an elemental metal, metal alloy, or metal compound, such as for example Mo, Ta, Ti, W, HfN, NiTa, $Mo_2N$, TaN, TiN, WN, and WSi and combinations thereof. The gate electrode 30 may also be a metal compound comprising a metal combined with nitrogen or silicon. The gate electrode 30 can further be a non-metal conductor having an appropriate work function such as, for example, polycrystalline silicon. Conventional PVD, ALD and CVD methods can be used to deposit the gate electrode 30.

The gate electrode 30, top dielectric layer 28, silicon nitride layer 26 and the silicon oxide layer 24 are patterned to form a stacked structure as shown in FIG. 1. Thereafter, a dopant is implanted into the surface of the semiconductor substrate 22 exposed on both sides of the stacked structure to form doped regions. The doped regions are thermally treated to form a source 32 and a drain 34, completing the unit cell of the flash memory device 20. In the flash memory device 20, the silicon nitride layer 26 serves as a charge-trap which traps and stores charge. Electrons that tunnel through the silicon dioxide layer 24 can be trapped in the silicon nitride layer 26. The threshold voltage varies depending on whether electrons are already trapped in the charge trap layer.

Without being limited by an explanation, it has been discovered that better charge retention properties can be obtained by treating the silicon nitride layer 26 by one of several different methods, and combinations of these methods. It has been determined that the charge trap concentration and distribution in the silicon nitride layer 26 depends on its composition and structure. Specifically, it is believed that the ratio of the concentration of silicon dangling bonds to nitrogen dangling bonds in the silicon nitride layer 26 affects the charge retention properties of the layer. It is further believed that charge retention time can be increased by increasing or maximizing the concentration of the silicon dangling bonds. Increasing the number of silicon dangling bonds in the silicon nitride layer 26 appears to increase the carrier trap concentration. However, silicon dangling bonds create very shallow traps in the energy bandgap. The shallow traps comprise potential energy levels that are not sufficiently deep. As a result, a silicon nitride layer 26 having a high concentration of silicon dangling bonds increases the potential of charge loss. Even small amounts of thermal energy can result in thermal de-trapping of the retained charge, and consequently, charge loss.

It is believed that the presently described methods of treating the silicon nitride layer 26 increase the concentration of dangling bonds at deeper energy levels in the band-gap to reduce the probability of thermal or other de-trapping of charge. Further, when charge is entrapped in specific sites corresponding to deep energy wells, charge retention is substantially increased as the charge tends to remain isolated within the energy well and does not easily migrate or diffuse out of the trap site with the application of external energy. Thus, the number of charge trap sites, as well as the depths of the potential energy wells, that are created in the silicon nitride layer 26 can significantly improve and increase charge retention.

One method of increasing number of available charge trap sites having deeper energy wells comprises increasing the number of dangling nitrogen bonds within the silicon nitride layer 26. The dangling nitrogen bonds generally have a deeper potential well compared to the silicon dangling bonds. One way of increasing the number of dangling nitrogen bonds is to remove hydrogen atoms from the silicon nitride layer 26. In addition, adding dopant materials to the silicon nitride layer 26 can also result in redistribution of electrons within the network towards the dopant sites, which further increases the number of nitrogen dangling bonds.

However, it is still desirable to maintain a substantial number of silicon dangling bonds. This is because the silicon dangling bonds are easier to induce in the structure, and also improve the charge retention speed. Specifically, because the silicon dangling bonds have broad, shallow energy wells, less energy is needed to transfer a charge into the charge trap site created by the presence of a silicon dangling bond. Consequently, it is desirable to have a certain ratio of silicon dangling bonds in addition to the nitrogen dangling bonds to optimize charge retention speed while still extending charge retention time. The presently described methods of depositing and treating the silicon nitride layer 26 are believed to desirably introduce optimal ratios of silicon and nitrogen dangling bonds.

In one aspect of the present process, it has been determined that the charge trap retention time can be increased by controlling processing parameters during deposition of the silicon nitride layer 26. In a PECVD process, silicon nitride is deposited using a process gas comprising a silicon-containing component and a nitrogen-containing component, or a single component that contains both silicon and nitrogen. The silicon-containing component can be, for example, silane, disilane, trimethylsilyl (TMS), tris(dimethylamino)silane (TDMAS), bis(tertiary-butylamino)silane (BTBAS), dichlorosilane (DCS), and combinations thereof. A suitable silane flow rate is from about 5 to about 200 sccm. The nitrogen-containing component can be, for example, ammonia, nitrogen, and combinations thereof. A suitable flow rate for ammonia is from about 10 to about 600 sccm. Unless otherwise specified, in these processes, the electrode power level is typically maintained at from about 100 to about 400 Watts; electrode spacing is from about 5 mm (200 mils) to about 12 mm (600 mils); process gas pressure is from about 1 Torr to about 4 Torr; and substrate temperature is from about 300 to about 600° C.

The process gas can also include a diluent gas that is provided in a larger volume that the reactive gas components to serve as a diluent, and at least partially as a reactant nitrogen-containing gas. For example, nitrogen can be added in a flow rate of from about 5000 to about 30,000 sccm. The process gas may also contain additional gases such as an oxygen-containing gas, for example, oxygen, when depositing silicon oxy-nitride materials. Still other gases that can be included can be inert gases, such as for example, helium or argon, in a flow rate of from about 100 to about 5,000 sccm.

In one aspect, the deposition conditions are changed during the deposition process to form a silicon nitride layer 26 having a compositional gradient in which the ratio of silicon to nitrogen varies through the thickness of the layer. The adjustment in process conditions are selected to provide a silicon nitride layer comprising a compositional gradient in which the ratio of silicon to nitrogen varies through the thickness by an amount sufficiently high to increase the charge retention time of the silicon nitride layer relative to the uniform silicon nitride layer.

In one version of this process, silicon nitride having a first ratio of silicon to nitrogen is deposited on the substrate. In this process, a process gas is introduced into the process zone, the process gas comprising a silicon-containing component to nitrogen-containing component as described herein. A plasma of the process gas in the process zone is generated by applying energy at a first power level to electrodes about the processes zone. Thereafter, silicon nitride having a second ratio of silicon to nitrogen is deposited by changing the energy applied to electrodes to a second power level. In one version, the first power level is a least about 200 W higher than the second power level. For example, the first power level can comprise less than about 3000 Watts, and the second power level comprises at least about 10 Watts.

In another version of this process, silicon nitride having a first ratio of silicon to nitrogen is deposited on the substrate by maintaining a first pressure of a process gas into the process zone while generating a plasma of the process gas in the process zone. Thereafter, silicon nitride having a second ratio of silicon to nitrogen by maintaining a second pressure of the process gas in the process zone. For example, the first pressure can be higher than the second pressure by least about 0.1 Torr. In one version, the first pressure is less than about 20 Torr, and the second pressure is at least about 1 Torr.

In yet another version, silicon nitride having a first and second ratio of silicon to nitrogen is formed on the substrate by changing a composition of the process gas introduced into the process zone. For example, silicon nitride can be deposited using a process gas comprising a silicon-containing gas component comprising silane ($SiH_4$), a nitrogen-gas component comprising ammonia ($NH_3$), and a diluent gas component comprising nitrogen ($N_2$). Initially, a first process gas comprising a first ratio of silicon-containing component to nitrogen-containing component is used, and a plasma of the process gas is generated in the process zone. Thereafter, a second process gas comprising a second ratio of silicon-containing component to nitrogen-containing component is used, and a plasma of the process gas is generated in the process zone. The first ratio of silicon-containing component to nitrogen-containing component is less than about 100:1, and the second first ratio of silicon-containing component to nitrogen-containing component is at least about 1. For example, the ratio of silane to ammonia can range from about 1:1 to about 1:3.

In one example, the flow rate of $NH_3$ can be maintained at 500 sccm while the flow rate of $SiH_4$ was varied from 25 sccm to 50 sccm; and the process conditions are held constant with a flow rate of $N_2$ at 20,000 sccm; a pressure of 6 Torr; a power level of 30 Watts; a temperature of 430° C., and process electrode spacing of 12 mm (480 mils).

In another example, the flow rate of $NH_3$ can be varied from 50 sccm to 500 sccm with a constant flow rate of $SiH_4$ of 25 or 50 sccm.

Generally, the lower ratio of $SiH_4$ flow rate to $NH_3$ flow rate provides a nitrogen-rich film. Thus when the ratio of the flow rate of $SiH_4$ to $NH_3$ is 1:10 the process will deposit a silicon nitride material having a Si/N ration of 0.6.

In the versions described above, the resultant flash memory device 20 comprises a silicon nitride layer 26 having a compositional gradient in which the ratio of silicon to nitrogen varies through the thickness of the layer. For example, the silicon nitride layer 26 can have a compositional gradient in which the ratio of silicon to nitrogen varies through the thickness by an amount sufficiently high to increase the charge retention time of the silicon nitride layer relative to the un-doped silicon nitride layer. In one version, silicon nitride layer comprises a compositional gradient in which the ratio of silicon to nitrogen varies through the thickness by at least about 1%. The silicon nitride layer can also have a compositional gradient in which the ratio of silicon to nitrogen varies through the thickness by from about 0.4 to about 1.5. The composition of the variant silicon nitride layer can also be doped with a dopant comprising carbon, boron or oxygen, as described below.

Figure 2:
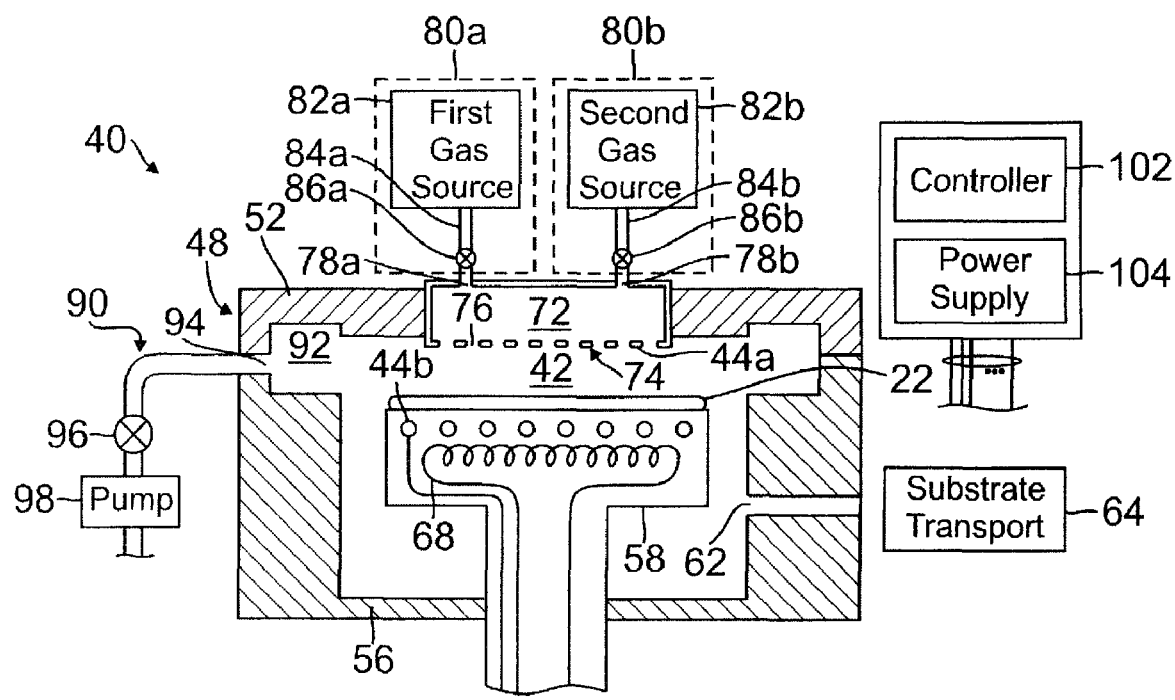
FIG. 2 is a schematic view of an embodiment of a substrate processing chamber that is a PE-CVD deposition chamber.

An embodiment of a substrate processing chamber 40 which can be used to perform the above described nitride deposition processes, is illustrated in FIG. 2. The chamber 40 is provided to illustrate an exemplary chamber however, other chambers may also be used, as would be apparent to one of ordinary skill in the art. Accordingly, the scope of the invention should not be limited to the exemplary chamber described herein.

Generally, the chamber 40 is a plasma enhanced chemical vapor deposition (PE-CVD) chamber suitable for processing a substrate 22, such as a silicon wafer, a suitable chamber being a Producer® SE type chamber from Applied Materials, Santa Clara, Calif. The chamber 40 comprises enclosure walls 48, which include a ceiling 52, sidewalls 54, and a bottom wall 56, that enclose a process zone 42. The chamber 40 may also comprise a liner (not shown) that lines at least a portion of the enclosure walls 48 about the process zone 42. For processing a 300 mm silicon wafer, the chamber typically has a volume of about 20,000 to about 30,000 $cm^3$, and more typically about 24,000 $cm^3$.

During a process cycle, the substrate support 58 is lowered and a substrate 22 is passed through an inlet port 62 and placed on the support 58 by a substrate transport 64, such as a robot arm. The substrate support 58 can be moved between a lower position for loading and unloading, and an adjustable upper position for processing of the substrate 22. The substrate support 58 can include an enclosed electrode 44a to generate a plasma from process gas introduced into the chamber 40. The substrate support 58 can be heated by heater 68, which can be an electrically resistive heating element (as shown), a heating lamp (not shown), or the plasma itself. The substrate support 47 typically comprises a ceramic structure which has a receiving surface to receive the substrate 22, and which protects the electrode 44a and heater 68 from the chamber environment. In use, a radio frequency (RF) voltage is applied to the electrode 44a and a direct current (DC) voltage is applied to the heater 68. The electrode 44a in the substrate support 58 can also be used to electrostatically clamp the substrate 22 to the support 58. The substrate support 58 may also comprise one or more rings (not shown) that at least partially surround a periphery of the substrate 22 on the support 58.

After a substrate 22 is loaded onto the support 58, the support 58 is raised to a processing position that is closer to the gas distributor 72 to provide a desired spacing gap distance, $d_s$, therebetween. The spacing distance can be from about 2 mm to about 12 mm. The gas distributor 72 is located above the process zone 42 for dispersing a process gas uniformly across the substrate 22. The gas distributor 72 can separately deliver two independent streams of first and second process gas to the process zone 42 without mixing the gas streams prior to their introduction into the process zone 42, or can premix the process gas before providing the premixed process gas to the process zone 42. The gas distributor 72 comprises a faceplate 74 having holes 76 that allow the passage of process gas therethrough. The faceplate 74 is typically made of metal to allow the application of a voltage or potential thereto, and thereby serve as electrode 44a in the chamber 40. A suitable faceplate 74 can be made of aluminum with an anodized coating.

The substrate processing chamber 40 also comprises first and second gas supplies 80a,b to deliver the first and second process gas to the gas distributor 72, the gas supplies 80a,b each comprising a gas source 82a,b, one or more gas conduits 84a,b, and one or more gas valves 86a,b. For example, in one version, the first gas supply 80a comprises a first gas conduit 84a and a first gas valve 86a to deliver a first process gas from the gas source 80a to a first inlet 78a of the gas distributor 72, and the second gas supply 80b comprises a second gas conduit 84b and a second gas valve 86b to deliver a second process gas from the second gas source 80b to a second inlet 78b of the gas distributor 72.

The process gas can be energized by coupling electromagnetic energy, for example, high frequency voltage energy to the process gas to form a plasma from the process gas. To energize the first process gas, a voltage is applied between (i) a first electrode 44a, which may be the gas distributor 72, ceiling 52 or chamber sidewall 54, and (ii) the electrode 44b in the support 58. The voltage applied across the pair of electrodes 44a, 44b capacitively couples energy to the process gas in the process zone 42. Typically, the voltage applied to the electrodes 44a,b is an alternating voltage which oscillates at a radio frequency. Generally, radio frequencies cover the range of from about 3 kHz to about 300 GHz. For the purposes of the present application, low radio frequencies are those which are less than about 1 MHz, and more preferably from about 100 KHz to 1 MHz, such as for example a frequency of about 300 KHz. Also for the purposes of the present application, high radio frequencies are those from about 3 MHz to about 60 MHz, and more preferably about 13.56 MHz. The selected radio frequency voltage is applied to the first electrode 44a at a power level of from about 10 W to about 1000 W, and the second electrode 44b is typically grounded. However, the particular radio frequency range that is used, and the power level of the applied voltage, depend on the type of material to be deposited.

The chamber 40 also comprises a gas exhaust 90 to remove spent process gas and byproducts from the chamber 40 and maintain a predetermined pressure of process gas in the process zone 42. In one version, the gas exhaust 90 includes a pumping channel 92 that receives spent process gas from the process zone 42, an exhaust port 94, a throttle valve 96 and one or more exhaust pumps 98 to control the pressure of process gas in the chamber 40. The exhaust pumps 98 may include one or more of a turbo-molecular pump, cryogenic pump, roughing pump, and combination-function pumps that have more than one function. The chamber 40 may also comprise an inlet port or tube (not shown) through the bottom wall 56 of the chamber 40 to deliver a purging gas into the chamber 40. The purging gas typically flows upward from the inlet port past the substrate support 58 and to an annular pumping channel. The purging gas is used to protect surfaces of the substrate support 58 and other chamber components from undesired deposition during the processing. The purging gas may also be used to affect the flow of process gas in a desirable manner.

A controller 102 is also provided to control the operation, and operating parameters, of the chamber 40. The controller 102 may comprise, for example, a processor and memory. The processor executes chamber control software, such as a computer program stored in the memory. The memory may be a hard disk drive, read-only memory, flash memory or other types of memory. The controller 102 may also comprise other components, such as a floppy disk drive and a card rack. The card rack may contain a single-board computer, analog and digital input/output boards, interface boards and stepper motor controller boards. The chamber control software includes sets of instructions that dictate the timing, mixture of gases, chamber pressure, chamber temperature, microwave power levels, high frequency power levels, support position, and other parameters of a particular process.

The chamber 40 also comprises a power supply 104 to deliver power to various chamber components such as, for example, the first electrode 44a in the substrate support 58 and the second electrode 44b in the chamber. To deliver power to the chamber electrodes 44ab, the power supply 104 comprises a radio frequency voltage source that provides a voltage having the selected radio frequencies and the desired selectable power levels. The power supply 104 can include a single radio frequency voltage source, or multiple voltage sources that provide both high and low radio frequencies. The power supply 104 can also include an RF matching circuit. The power supply 104 can further comprise an electrostatic charging source to provide an electrostatic charge to an electrode often electrostatic chuck in the substrate support 58. When a heater 68 is used within the substrate support 58, the power supply 104 also includes a heater power source that provides an appropriate controllable voltage to the heater 68. When a DC bias is to be applied to the gas distributor 72 or the substrate support 58, the power supply 104 also includes a DC bias voltage source that is connected to a conducting metal portion of the faceplate 74 of the gas distributor 72. The power supply 104 can also include the source of power for other chamber components, for example, motors and robots of the chamber.

The substrate processing chamber 40 also comprises a temperature sensor (not shown) such as a thermocouple or an interferometer to detect the temperature of surfaces, such as component surfaces or substrate surfaces, within the chamber 40. The temperature sensor is capable of relaying its data to the chamber controller 102 which can then use the temperature data to control the temperature of the processing chamber 40, for example, by controlling the resistive heating element in the substrate support 58.

Dopant Material

In another version, the silicon nitride layer 26 is doped with a material that creates better charge trap sites. A suitable material comprises, for example, carbon, boron, oxygen, or mixtures thereof. In this method, a doped silicon nitride layer is formed on the silicon dioxide layer 24. The doped silicon nitride layer comprises a dopant level of any one of carbon, boron or oxygen. The dopant is provided in a percentage sufficiently high to increase the charge retention time of the silicon nitride layer 26 relative to the un-doped silicon nitride layer. In one version, the dopant level is such that the percentage of dopant in the silicon nitride, is sufficiently high to increase the charge retention time of the silicon nitride layer 26 relative to the un-doped silicon nitride layer by at least about 5%. For example, suitable level of dopant comprises a percentage of from about 1% to about 50%, relative to the silicon nitride material. The dopant is introduced in the film during deposition by adding a dopant-containing precursor to the deposition chemistry. For example to achieve 5% B doping, 100 sccm B2H6 is added to a plasma of SiH4 (40 sccm) and NH3 (1000 sccm)

Several methods can be used to dope the silicon nitride layer 26 with dopant comprising carbon, boron or oxygen. In one method, a silicon nitride layer 26 is deposited using conventional methods. For example, the silicon nitride layer 26 can be deposited using a process gas comprising $SiH_4$, $NH_3$, and $N_2$, as explained above. During or after deposition of the silicon nitride layer 26, the layer is exposed to a dopant process gas comprising at least one of carbon-containing species, boron-containing species or oxygen-containing species. The dopant process gas is energized to form a plasma to dope the deposited silicon nitride layer 26 with a dopant comprising carbon, boron or oxygen. Suitable examples of the dopant process gas include carbon-containing species such as TMS, $C_2H_4$, boron-containing species such as Diborane, and/or oxygen-containing species such as $N_2O$, or mixtures thereof. The dopant process gas is energized using a plasma powered by electrodes maintained at distance between 100 and 1200 mils.

In another method, a silicon nitride layer 26 is deposited and then exposed to a process gas comprising at least one of carbon, boron or oxygen, while the substrate is heated to dope the deposited silicon nitride layer 26 with a dopant comprising carbon, boron or oxygen. Suitable examples of the dopant process gas include carbon-containing species such as $CH_4$, TMS, boron-containing species such as $B_2H_6$, and/or oxygen-containing species such as $N_2O$, or mixtures thereof. During the doping process, the substrate is heated to a temperature of at least about 50° C., or even from about 300° C. to about 550° C.

The chamber described above, and shown in FIG. 2, can also be used to process the silicon nitride layer 26 to form a doped silicon nitride layer as described. The resultant flash memory device 20 comprises a substrate comprising silicon, a silicon dioxide layer 24 on the substrate, and a doped silicon nitride layer 26 on the silicon dioxide layer, the doped silicon nitride layer comprising a dopant comprising carbon, boron or oxygen.

Ultraviolet Radiation Exposure

In another method of forming the flash memory device, during or after deposition of a silicon nitride layer 26, the layer is exposed to an energy beam, such as ultraviolet radiation or an electron beam. It is believed that both ultraviolet radiation and electron beams increase the charge trap depth in the silicon nitride layer by at least 5%. Exposure of the deposited silicon nitride material to ultraviolet radiation or electron beams results in reduction of the hydrogen content of the deposited material by disrupting unwanted hydrogen bonds, such as the Si—H and N—H bond which absorb broadband UV radiation. The remaining silicon atom bonds with available nitrogen atoms form Si—N bonds. From FTIR spectrum, it is seen that after treatment with ultraviolet radiation, the size of both the N—H stretch peak and the Si—H stretch peak significantly decrease, while the size of the Si—N stretch peak increases. This demonstrates that after ultraviolet treatment, the resultant silicon nitride material contains fewer N—H and Si—H bonds, and an increased number of Si—N bonds which are desirable.

The ultraviolet or electron energy beam exposure can be performed within the deposition chamber 40 itself or in a separate chamber. For example, during, or immediately after, deposition of a silicon nitride layer 26 on the substrate 22, the silicon nitride layer 26 can be exposed to ultraviolet or electron beam radiation inside the deposition chamber 40. The ultraviolet or electron beams can be applied in-situ in the CVD chamber. It is believed that ultraviolet or electron beam exposure during deposition, disrupts undesirable bonds as they are formed to increase the depth of the charge traps which are formed in the silicon nitride layer 26.

Figure 4A:
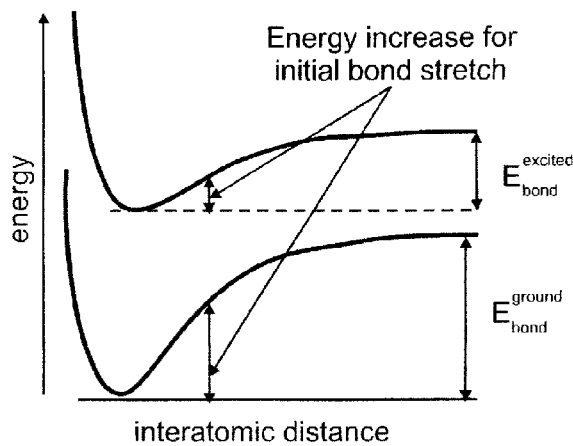
FIG. 4A is a model showing bond energy as a function of interatomic distance for ground and excited state bonds.

A model showing bond energy as a function of interatomic distance for an R—H bond, where R is a base atom such as, for example N in the case of ($H_3Si$)N—H, is shown in FIG. 4A. The bond energy plot is shown for a ground state bond and for an excited bond. The energy required to stretch the excited bond by an initial distance is substantially smaller than the energy required to stretch the ground state bond by the same initial distance, as shown by vertical arrows. Thus it is easier to cleave the bond from the excited state than directly from the ground state and the desirable dangling bonds, which are formed by bond cleavage, are thus easier to obtain from excited state bonds.

Figure 4B:
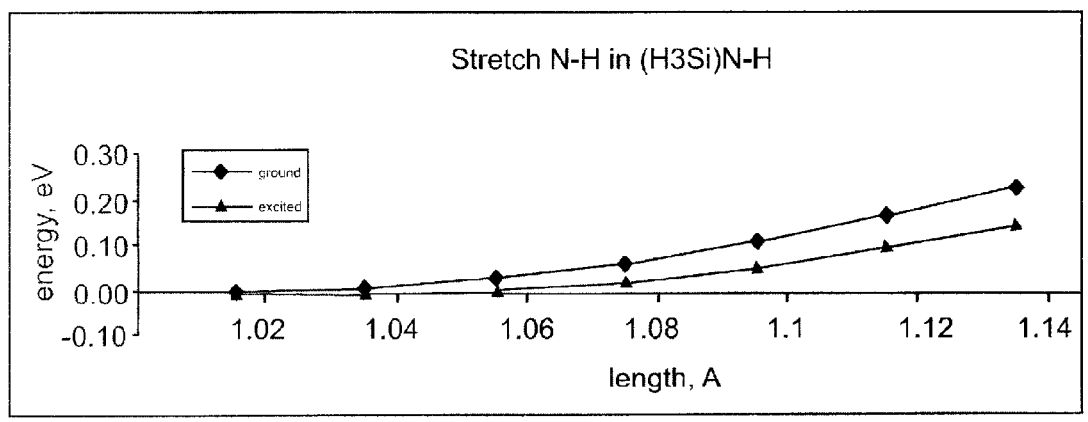
FIG. 4B is a model showing the energy required to stretch the N—H bond of $(H_3Si)N$—H, for both excited state and ground state bonds.

A model showing the energy required to stretch the N—H bond of ($H_3Si$)N—H, for both excited state N—H bond and ground state N—H bond is shown in FIG. 4B. This further illustrates that bond stretch of an excited state bond requires less energy than bond stretch of a ground state bond. Accordingly, it is believed that bond cleavage and dangling bond formation is the mechanism that increases the depth of the charge traps that are formed in the silicon nitride layer 26.

Figure 3:
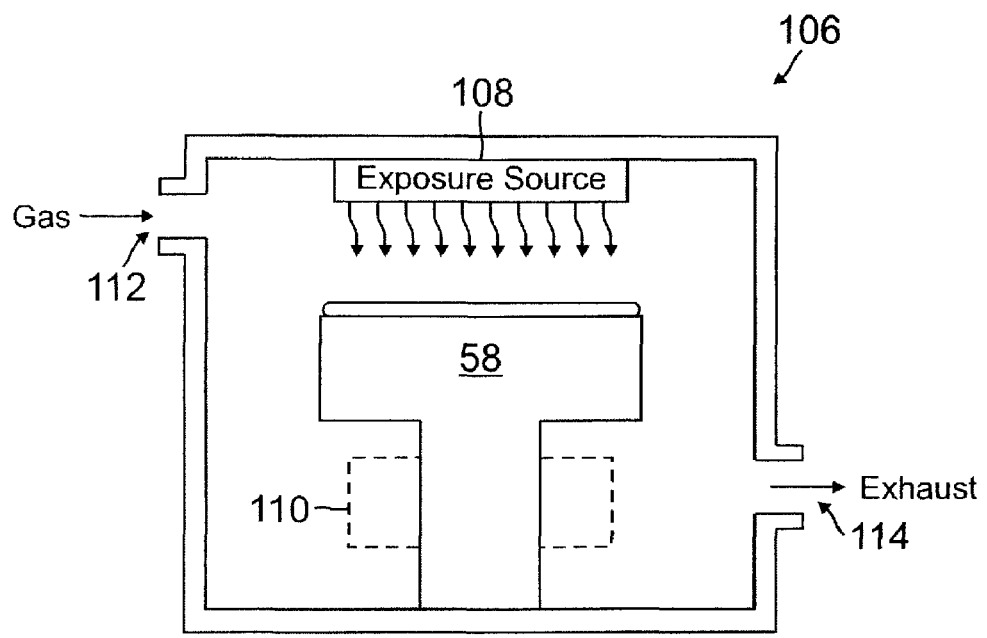
FIG. 3 is a schematic view of an exposure chamber suitable for exposing a silicon nitride material to a suitable energy beam source.

FIG. 3 shows an exemplary embodiment of an exposure chamber 106 which can be used to expose a substrate 22 to ultraviolet radiation or electron beam treatment. In the version shown, the chamber 106 includes a substrate support 58 moveable between a released position distal from the exposure source 108, and a lifted position proximate to the source 108 to allow adjustment of the spacing therebetween. A substrate support 58 supports the substrate 22 in the chamber 106. During insertion and removal of the substrate 22 from the exposure chamber 106, the substrate support 58 can be moved to a loading position, and thereafter, during exposure of the substrate 22 having the deposited silicon nitride material to ultraviolet radiation or electron beams, the support 58 is raised into the lifted position to maximize exposure levels. The chamber 106 further comprises a heater 110, such as a resistive element, which can be used to heat the substrate 22 to a desired temperature during exposure of the substrate 22. A gas inlet 112 is provided to introduce a gas into the exposure chamber 106 and a gas outlet 114 is provided to exhaust the gas from the chamber 106.

The exposure chamber 106 further includes an exposure source 108 that provides a suitable energy beam, such as ultraviolet radiation or electron beams. A suitable ultraviolet radiation source can emit a single ultraviolet wavelength or a broadband of ultraviolet wavelengths. A suitable single wavelength ultraviolet source comprises an excimer ultraviolet source that provides a single ultraviolet wavelength of 172 nm or 222 nm. A suitable broadband source generates ultraviolet radiation having wavelengths of from about 200 to about 400 nm. Such ultraviolet sources can be obtained from Fusion Company, USA or Nordson Company, USA. The silicon nitride material may be exposed to ultraviolet radiation having other wavelengths that are generated by lamps that contain gas that radiates at specific wavelengths when electrically stimulated. For example, suitable ultraviolet lamp may comprise Xe gas, which generates ultraviolet radiation having a wavelength of 172 nm. In other versions, the lamp may comprise other gases having different corresponding wavelengths, for example, mercury lamps radiate at a wavelength of 243 nm, deuterium radiates at a wavelength of 140 nm, and $KrCl_2$ radiates at a wavelength of 222 nm. By varying the relative concentration of the gases, the wavelength content of the output from the radiation source can be selected to simultaneously expose all of the desired wavelengths, thus minimizing the necessary exposure time. In another version a mercury lamp can be used to generate a broad band spectrum with highest intensity between 200 and 600 nm.

The CVD deposition chamber 40 and exposure chamber 106 may also be integrated together on a multi-chamber processing platform (not shown) served by a single robot arm. The components of the exposure chamber 106 and of the CVD deposition chamber 40, which can include exposure source 108, substrate support 58, motor, valves or flow controllers, gas delivery system, throttle valve, high frequency power supply, and heater, and the robot arm of the integrated processing system, may all be controlled by a system controller over suitable control lines. The system controller relies on feedback from optical sensors to determine the position of movable mechanical assemblies such as the throttle valve 96 and substrate support 58 which are moved by appropriate motors under the control of the controller.

For exposure treatment in a separate exposure chamber 106, a substrate having a silicon nitride layer 26 according to any of the deposition processes described or other deposition processes known in the art, is inserted into the exposure chamber 106 and placed upon the substrate support 58 in the lowered position. The substrate support 58 is then raised to a lifted position, the optional heater 110 in the support powered on, and the exposure source 108 is activated. During exposure, a gas may be circulated through the exposure chamber 106, such as helium, to improve thermal heat transfer rates between the substrate and the support. Other gases may also be used. After a period of radiation exposure, the exposure source 108 is deactivated and the substrate support 58 is lowered back into the released position. The substrate bearing the exposed silicon nitride layer 26 is then removed from the exposure chamber 106. This process can alternately be performed in-situ in the process chamber 40 when the process chamber is equipped with necessary exposure source 108.

Suitable deposition process conditions are described above. The ultraviolet treatment was performed at 400° C., with a total exposure time of 5 to 10 minutes. The silicon nitride layer 26 can be deposited with a process gas comprising 60 sccm flow rate of silane; 900 sccm flow rate of ammonia; 10,000 sccm flow rate of nitrogen; and at 6 Torr process gas pressure; an electrode power level of 100 watt; and electrode spacing of 11 mm. The wavelength of the broadband ultraviolet radiation was from about 200 to about 1200 nm. For example, a Fusion H UV light source provides UV wavelengths of about 200 to 400 nm; and an Excimer UV source provides UV wavelengths of about 172 nm.

It was also determined that the effect of the ultraviolet exposure could be enhanced by providing an optimal range of the diluent gas content to the process gas during the deposition process. This was done to reduce the number of nitrogen-hydrogen bonds in the deposited material, which are typically more difficult to remove by the ultraviolet treatment than silicon-hydrogen bonds. Thus, in one embodiment, the silicon nitride layer 26, which was subsequently subjected to ultraviolet exposure, was deposited at slightly different process conditions in which the diluent gas flow was reduced to the range of from about 5000 to about 15,000 sccm and more preferably about 10,000 sccm. The silane and ammonium volumetric flow ratios and flow rates were from about 1:2 to about 1:15, and more preferably about 1:10.

Electron Beam Exposure

The silicon nitride material can also be treated by exposure to an electron beam in the exposure chamber 106. An exposure source 108 comprising a source of electron beams can comprise, for example, a line electron source that is scanned across the deposited material, or even a large area electron beam exposure system, such as that described in U.S. Pat. No. 5,003,178 to Livesay, which is incorporated herein by reference in its entirety. In one version, the electron beam exposure is conducted with an electron beam which covers an area of from about 4 square inches to about 256 square inches. The electron beam exposure conditions include the total dosage applied, the electron beam energy applied to the deposited material, and the electron beam current density.

In one version, the electron beam exposure is performed in a vacuum of from about $10^{-5}$ to about $10^{-2}$ Torr, and with a substrate temperature in the range of from about 100° C. to about 400° C. The exposure energy may be in the range of from about 0.1 to about 100 keV, and the electron beam current is typically from about 1 to about 100 mA. The electron beam dose falls into the range of from about 1 to about 100,000 $\mu C/cm^2$. The dose and energy selected will be proportional to the thickness of the deposited material to be processed. Generally, the electron beam exposure will be from about 0.5 minute to about 10 minutes. In one prospective example, the electron beam treatment can be carried out at 4 KV, with a current of 6 mA, at a substrate temperature of 400° C., to provide a dosage of 200 to 1500.

The deposition of the silicon nitride and electron beam treatment can also be conducted in a cluster platform tool having a CVD chamber, an electron beam irradiation chamber, and a robot for transferring the substrate from the CVD chamber to the e-beam chamber. The treatment in the CVD and e-beam chambers and the transferring operations are conducted in vacuum conditions.

Plasma Treatment

The silicon nitride layer 26 can also be plasma-treated to increase charge retention time. In one method of plasma treatment, one or more layers of silicon nitride are deposited in a CVD process chamber, by introducing a first process gas into a process zone containing the substrate, the process gas comprising a silicon-containing component and a nitrogen-containing component. A plasma is generated from the first process gas, for example, by inductively or capacitively coupling power to the process gas. The energized process gas deposits a layer of silicon nitride on the substrate.

The deposited layer is plasma treated by stopping or changing the flow of the first process gas to introduce a second process gas into the process zone. The second process gas comprises an inert or non-reactive gas (which may be a component of the first process gas or a different gas). The second process gas is energized to generate a plasma by inductively or capacitively coupling power to the process gas. The energized plasma treats the deposited silicon nitride layer to increase the charge retention time of the layer.

It is further believed that the potential energy wells of the charge trap layer can be made deeper by treating the deposited silicon nitride film with a nitrogen plasma treatment cycle. The nitrogen plasma treatment can be performed by modifying the silicon nitride deposition process into two process cycles. The first cycle is used to deposit the silicon nitride layer on the substrate using a first process gas comprising a first component comprising silicon-containing gas and nitrogen-containing gas, and a second component comprising a diluent nitrogen gas, and forming a plasma. In the second, nitrogen plasma treatment cycle, the flow of the first component of the process gas which includes the silicon-containing gas and the nitrogen-containing gas is turned off to provide a flow only of the second component comprising the diluent nitrogen gas. In both cycles, a high frequency voltage can be supplied to the electrodes 44*a,b* to form the plasma. The process cycles are repeated a number of times during deposition of the silicon nitride material.

Without being limited by a proposed explanation, it is believed that the nitrogen plasma cycles reduce the hydrogen content in the silicon nitride layer 26 and promote the formation of silicon-nitrogen bonds by removing silicon-hydrogen bonds. However, since the nitrogen plasma treatment can only affect a thin surface region of the deposited silicon nitride film, a nitrogen treatment cycle is performed after short deposition process cycles in which only a thin film of silicon nitride is deposited on the substrate. The thickness of the initial film is sufficiently thin to allow the nitrogen plasma treatment to penetrate substantially the entire thickness of the deposited material. If the nitrogen plasma treatment was performed after deposition of the entire thickness of the silicon nitride film 26, only a thin surface region of the deposited material would be properly treated.

Thus the plasma treatment process comprises a sufficient number of deposition cycles followed by plasma treatment cycles to achieve the desired film thickness. For example, a deposition process comprising twenty (20) process cycles that each comprise a first deposition cycle and a second nitrogen plasma treatment cycle, can be used to deposit and plasma treat silicon nitride material to a thickness of 500 angstroms. Each deposition cycle was performed for about 2 to about 10 seconds and more typically about 5 seconds; and each nitrogen plasma treatment cycle was performed for about 10 to about 30 seconds, and more typically 20 seconds.

Several deposition process parameters can be adjusted to improve the charge retention time of the deposited and plasma treated silicon nitride layer 26. For example, deposition at higher temperatures is believed to improve the number of nitrogen dangling bonds at a substrate temperature of from about 400 to about 500° C. Further, the plasma can be formed by applying a high radio frequency voltage to the electrode 44*a* and grounding the second electrode 44*b*, the high radio frequency being from about 3 MHz to about 60 MHz, such as for example, a frequency of 13.56 MHz. Activation of the CVD reaction by a plasma allows use of relatively lower substrate temperatures compared to thermally activated CVD processes. Also, the high RF voltages should be applied at relatively low power levels of from about 20 to about 100 watts, and less than about 200 watts.

The radio frequency voltage applied to the electrodes 44*a,b* of the chamber 40 can also be pulsed to generate a pulsed plasma. The pulsed plasma is believed to provide a more uniform thickness of the deposited material. The pulsed plasma is generated by applying voltage pulses of a radio frequency voltage to the electrodes bounding the process zone. The voltage pulses each have a duty cycle, which is the ratio of the pulse duration ($T_1$) to the pulse period ($T_2$). In a pulsed waveform, the pulse duration is the interval between (a) the time, during the first transition, that the pulse amplitude reaches a specified fraction (level) of its final amplitude, and (b) the time the pulse amplitude drops, on the last transition, to the same level. Generally, the interval between the 50% points of the final amplitude is used to determine or define pulse duration. Preferably, the voltage pulses are rectangular pulses, but they can also have other shapes, such as for example, square or sinusoidal pulses. The pulsed RF power is provided at a power level of from about 100 to about 500 Watts. The selected power level is relatively high because it is believed that at the high-power levels, $SiH_4$ and $NH_3$ will dissociate more completely and thus reduce the overall hydrogen content of the deposited film.

The duty cycle of the voltage pulses can also be selected to control the charge retention properties of the deposited silicon nitride layer 26. Different pulse types, radio frequency level, wattage, and the ratio $T_2/T_1$ can be selected to provide the desired properties. Smaller duty cycles that reduce the pulse duration ($T_1$) and/or increase the pulse period ($T_2$), were found to provide better charge retention. Preferably, the duty cycle is less than about 60%. The duty cycle range is preferably from about 10% to about 50%, and more preferably from about 20%. For such duty cycles, the pulse frequency ranges from 10 to 1000 Hz. In one preferred embodiment, the duty cycle is 20% (e.g. 0.25) for a pulse train at 50 Hz in which the pulse duration is 4 ms (e.g. 1 μs) and the pulse period is 20 ms (e.g. 4 μs). In the pulsed plasma processes, a high RF voltage having a frequency in the range of from about 3 MHz to about 60 MHz, was applied across the electrodes 44*a,b* at a power level of from about 100 to about 1000 Watts. A suitable process gas comprises silane, ammonia, nitrogen and optionally argon, in the flow ranges described herein.

A flash memory device comprising a silicon nitride layer 26 deposited in the chamber 40 as described in the exemplary processes provided herein, has a higher charge retention time, which is believed to result from a higher concentration of nitrogen dangling bonds.

Although exemplary embodiments of the present invention are shown and described, those of ordinary skill in the art may devise other embodiments which incorporate the present invention, and which are also within the scope of the present invention. Furthermore, the terms below, above, bottom, top, up, down, first and second and other relative or positional terms are shown with respect to the exemplary embodiments in the FIGS. and are interchangeable. Therefore, the appended claims should not be limited to the descriptions of the preferred versions, materials, or spatial arrangements described herein to illustrate the invention.

What is claimed is:

1. A method of forming a flash memory device, the method comprising:
   (a) forming a silicon dioxide layer on a substrate;
   (b) depositing a silicon nitride layer on the silicon dioxide layer;
   (c) exposing the silicon nitride layer to a dopant process gas comprising carbon-containing species;
   (d) forming a doped silicon nitride layer by energizing the dopant process gas to form a plasma to dope the silicon nitride layer with a dopant comprising carbon;
   (e) depositing a dielectric material on the doped silicon nitride layer; and
   (f) depositing a conductive gate on the dielectric material.

2. A method according to claim 1 wherein (d) comprises forming a doped silicon nitride layer comprising dopant in a percentage sufficiently high to increase the charge retention time of the doped silicon nitride layer relative to an un-doped silicon nitride layer by at least about 5%.

3. A method according to claim 1 wherein (d) comprises forming a doped silicon nitride layer comprising dopant in a percentage sufficiently high to increase the charge retention time of the doped silicon nitride layer relative to the un-doped silicon nitride layer by at least about 1%.

4. A method according to claim 1 wherein (d) comprises forming a doped silicon nitride layer comprising dopant in a percentage of from about 1% to about 50%.

5. A method according to claim 1 wherein in (b) the silicon nitride layer is deposited with a deposition process gas comprising $SiH_4$, $NH_3$ and $N_2$.

6. A method according to claim 1 wherein (d) comprises; heating the substrate to dope the deposited silicon nitride layer with the dopant comprising carbon.

7. A method according to claim 1 wherein the dielectric material comprises a high-k dielectric.

8. A method according to claim 1 wherein the dielectric material comprises aluminum oxide.

9. A method according to claim 1 wherein the conductive gate comprises titanium or tantalum.

10. A method of forming a flash memory device, the method comprising:
(a) forming a silicon dioxide layer on a substrate;
(b) depositing a silicon nitride layer on the silicon dioxide layer;
(c) during (b), exposing the silicon nitride layer to a plasma comprising an energized dopant process gas, the dopant process gas comprising a carbon-containing species, to dope the silicon nitride layer with a dopant comprising carbon;
(d) depositing a dielectric material on the doped silicon nitride layer; and
(e) depositing a conductive gate on the dielectric material.

11. A method according to claim 10 wherein the silicon nitride is deposited with a deposition process gas comprising $SiH_4$, $NH_3$, and $N_2$.

12. A method according to claim 10 wherein the dielectric material comprises a high-k dielectric.

13. A method according to claim 10 wherein the dielectric material comprises aluminum oxide.

14. A method according to claim 10 wherein the conductive gate comprises titanium or tantalum.

15. A method according to claim 10 wherein (b) comprises forming a doped silicon nitride layer comprising dopant in a percentage sufficiently high to increase the charge retention time of the doped silicon nitride layer relative to an un-doped silicon nitride layer by at least about 5%.

16. A method according to claim 10 wherein (b) comprises forming a doped silicon nitride layer comprising dopant in a percentage sufficiently high to increase the charge retention time of the doped silicon nitride layer relative to the un-doped silicon nitride layer by at least about 1%.

17. A method of forming a flash memory device, the method comprising:
(a) forming a silicon dioxide layer on a substrate;
(b) depositing a silicon nitride layer on the silicon dioxide layer;
(c) during (b), exposing the silicon nitride layer to a plasma comprising an energized dopant process gas, the dopant process gas comprising a carbon-containing species, to dope the deposited silicon nitride layer with a dopant comprising carbon;
(d) during (c), heating the substrate to dope the silicon nitride layer with a dopant comprising carbon;
(e) depositing a dielectric material on the doped silicon nitride layer; and
(f) depositing a conductive gate on the dielectric material.

18. A method according to claim 17 wherein the silicon nitride is deposited with a deposition process gas comprising $SiH_4$, $NH_3$, and $N_2$.

19. A method according to claim 17 wherein the dielectric material comprises a high-k dielectric.

20. A method according to claim 17 wherein the dielectric material comprises aluminum oxide.

21. A method according to claim 17 wherein the conductive gate comprises titanium or tantalum.

22. A method according to claim 17 wherein (c) comprises forming a doped silicon nitride layer comprising dopant in a percentage sufficiently high to increase the charge retention time of the doped silicon nitride layer relative to an un-doped silicon nitride layer by at least about 5%.

23. A method according to claim 17 wherein (c) comprises forming a doped silicon nitride layer comprising dopant in a percentage sufficiently high to increase the charge retention time of the doped silicon nitride layer relative to the un-doped silicon nitride layer by at least about 1%.

* * * * *